United States Patent [19]
Hanley

[11] Patent Number: 5,646,528
[45] Date of Patent: Jul. 8, 1997

[54] MAGNET ASSEMBLY

[75] Inventor: Peter Hanley, Lydney, United Kingdom

[73] Assignee: Oxford Instruments (UK) Ltd., Oxon, United Kingdom

[21] Appl. No.: 489,511

[22] Filed: Jun. 12, 1995

[30]  Foreign Application Priority Data

Jun. 15, 1994 [GB] United Kingdom ............... 942012

[51] Int. Cl.$^6$ ....................................................... G01V 3/00
[52] U.S. Cl. ........................................... 324/303; 324/320
[58] Field of Search ............................... 324/303, 307, 324/309, 314, 318, 319, 320, 322

[56]  References Cited

U.S. PATENT DOCUMENTS

| | | | |
|---|---|---|---|
| 4,350,955 | 9/1982 | Jackson et al. | 324/319 |
| 4,714,881 | 12/1987 | Givens | 324/318 |
| 5,153,514 | 10/1992 | Griffin et al. | 324/303 |
| 5,488,342 | 1/1996 | Hanley | 324/303 |

*Primary Examiner*—Louis M. Arana
*Attorney, Agent, or Firm*—Staas & Halsey

[57]  ABSTRACT

A magnet assembly having a pair of substantially aligned, spaced apart first magnets having like poles facing each other; and one or more auxiliary magnets axially aligned with the first magnets such that all magnets in the assembly are axially aligned. A magnetic field of sufficient homogeneity to perform a nuclear magnetic resonance (NMR) process is generated in a working region laterally offset form the first and second magnets. An oscillating magnetic field generating assembly is provided for performing an NMR experiment and includes a set of electrical coils connected to an oscillating electrical source. The coils are arranged between the first magnets such that the magnetic field generated by the oscillating magnet field generating assembly is also sufficiently uniform within the working region to perform an NMR experiment. A shield of electrically conductive material is positioned adjacent to and laterally offset form the set of electrical coils whereby the magnetic field generated by the oscillating magnetic field generating means is asymmetrically offset from the axis of the first magnets.

11 Claims, 3 Drawing Sheets

MAGNET ASSEMBLY

BACKGROUND OF THE INVENTION

1. Field of the Invention

The invention relates to a magnet assembly for generating a magnetic field of sufficient homogeneity in a working region to perform a NMR process.

2. Description of the Related Art

Magnet assemblies for generating homogeneous fields for the purposes of NMR are well known in a variety of fields but the present invention is particularly concerned, although not exclusively, with well logging applications. In these applications, the working region must be positioned outside the magnet assembly and in the surrounding rock in order to obtain NMR information from the rock. An early system of this type is described in U.S. Pat. No. 4,350,955.

In this arrangement, a pair of axially opposed magnets produce a radial field which has a maximum value and a region of uniformity over an annular volume whose radius is determined by the separation of the magnets. A variation on this scheme is described in WO-A-92/07279 whereby the volume of the homogeneous region is increased to improve the sensitivity of the NMR measurement.

These and similar systems are cylindrically symmetric. In some circumstances it may be desirable to deploy a well-logging instrument which takes the form of a "pad tool". These circumstances are, for example, when the size of the hole is much greater than the diameter of the tool, or when the hole is grossly irregular in section, and it is desired to exclude the response of the drilling fluid. Such a pad tool has been described in U.S. Pat. No. 4,933,638. The type of magnet system described in this has the drawback that the "throw" (i.e. the distance from the apparatus to the sensitive or working region) and the dimensions of the sensitive region have to be small compared to the dimensions of the magnet system in the transverse plane. This restricts the usefulness of this system.

One approach to solving this problem is described in WO-A-94/18577. In this approach, an auxiliary magnet is positioned with its magnetic axis transverse to the alignment axis of the main magnets. However, this is a relatively costly solution to the problem.

SUMMARY OF THE INVENTION

It is an object of the present invention to provide a new magnet assembly which can generate a working region having a homogenous magnetic field which is asymmetric relative to the magnetic assembly and offset from the magnet assembly and which is achieved without the need for additional magnets. This results in a significant power requirement reduction over an unshielded assembly.

Additional objects and advantages of the invention will be set forth in part in the description which follows, and, in part, will be obvious from the description, or may be learned by practice of the invention.

Objects of the present invention are achieved in a magnet assembly comprises a pair of substantially aligned, spaced apart first magnets having like poles facing each other; one or more auxiliary magnets axially aligned with the first magnets wherein all magnets in the assembly are axially aligned, whereby a magnetic field of sufficient homogeneity to perform a nuclear magnetic resonance (NMR) process is generated in a working region laterally offset from the first and second magnets; an oscillating magnetic field generating assembly for performing an NMR experiment, including a set of electrical coils connected to an oscillating electrical source, the coils being arranged between the first magnets and such that the magnetic field generated by the oscillating magnetic field generating assembly is also sufficiently uniform within the working region to perform an NMR experiment; and a shield of electrically conductive material adjacent to and laterally offset from the set of electrical coils whereby the magnetic field generated by the oscillating magnetic field generating means is asymmetrically offset from the axis of the first magnets.

The shield may have a semi-cylindrical form. In any event the open angle in the azimuthal direction determines the field of view and so this angle may be varied by making the shield more or less than a semi (or half) cylinder. Typically, the axial length of the shield should be long compared to the diameter of each of the electrical coils defining the oscillating magnetic field generating assembly. For example, in the preferred arrangement, the axial length of the shield is four to five times the diameter of the electrical coil.

Typically, particularly for well-logging applications, the magnets comprise permanent magnets although electrical coils operating in a resistive or superconducting mode could also be used.

In one example, the boundary of the working region nearest to the magnet assembly is spaced by more than substantially 10 cm from the alignment axis of the first magnets. Preferably, also, the working region has a lateral dimension of at least 10 cm.

Objects of the invention are also achieved in a NMR probe comprising a magnet assembly according to the invention; and a RF magnetic field generator for generating a substantially homogeneous RF magnetic field within the working region.

The RF magnetic field generator may be based on a conventional RF coil of the type described in U.S. Pat. No. 4,933,638 or as described in more detail below.

As has already been mentioned, the invention has particular application in the field of well logging. However, there are many other applications, including food monitoring in which the assembly is inserted into a storage silo or the like, or where, for example, the assembly is positioned to project the working region into the path of a conveyer, and magnetic resonance imaging of the human or animal body.

BRIEF DESCRIPTION OF THE DRAWINGS

These and other objects and advantages of the invention will become apparent and more readily appreciated from the following description of the preferred embodiments, taken in conjunction with the accompanying drawings of which.

DETAILED DESCRIPTION OF THE PREFERRED EMBODIMENT

Figure 1:
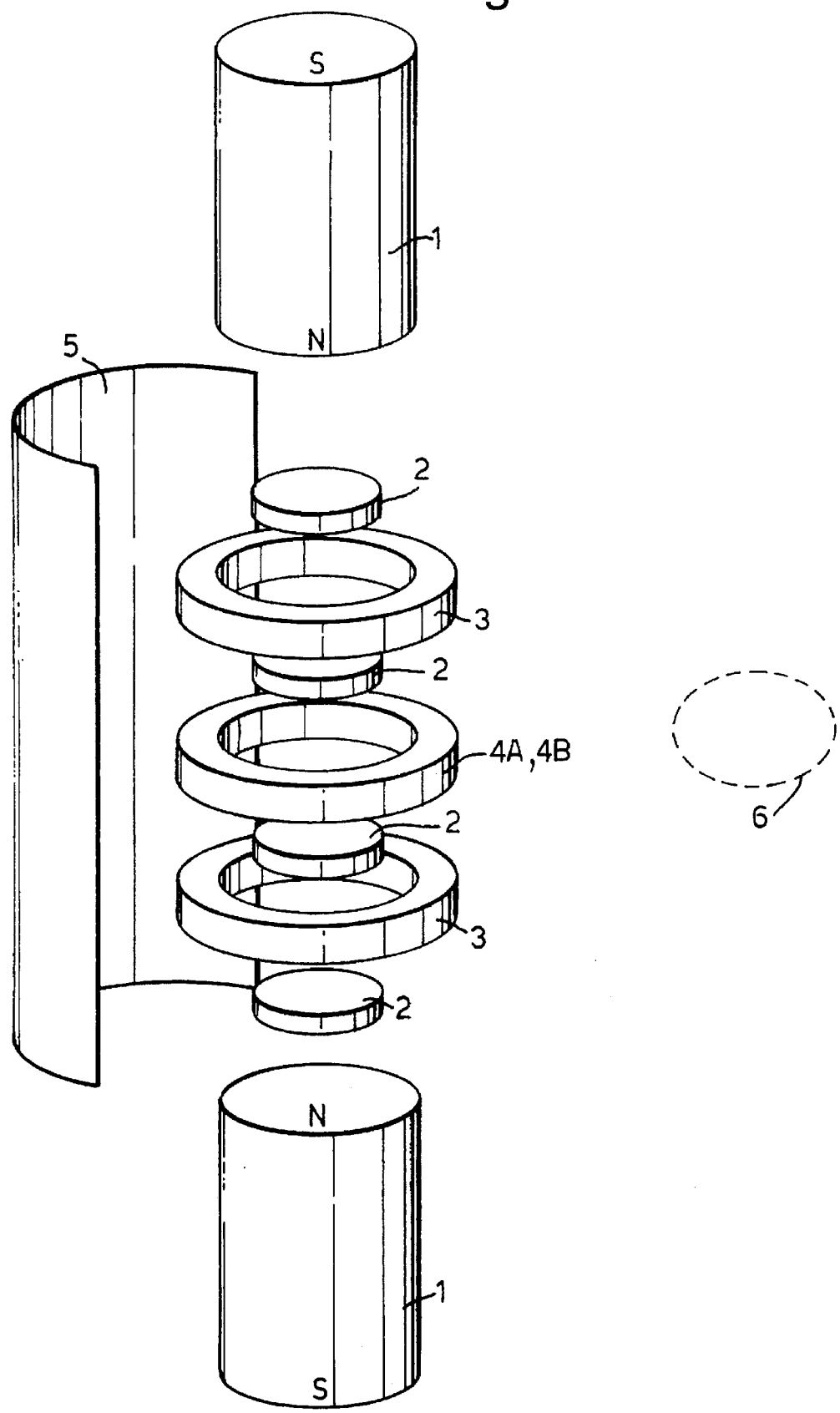
FIG. 1 is a schematic, perspective view of the assembly.

Reference will now be made in detail to the present preferred embodiments of the present invention, examples of which are illustrated in the accompanying drawings, wherein the like reference numerals refer to like elements throughout.

FIG. 1 is a schematic, perspective view of the assembly. The magnetic assembly shown in the drawing is for use in a well logging application and is based on the ideas described in more detail in WO 92/07279, WO 93/14413, and WO 94/11748 each of which is incorporated herein by reference.

The assembly comprises a pair of main, permanent magnets 1 arranged coaxially with like poles facing each other. Between the main magnets are positioned a set of auxiliary magnets 2 whose orientation and position and strength are chosen so as to generate a substantially steady magnetic field in a generally circular working region 6 laterally offset from the axes of the assembly and having a uniformity suitable for performing an NMR experiment (e.g. better than 100 ppm over a 50 cm sphere).

The magnets 1,2 will be mounted on a former (not shown) so that the assembly can be lowered into a bore hole, the working region 6 being spaced from the assembly so as to be positioned within rock surrounding the bore hole.

A pair of transmitter coil windings 3 are positioned coaxially with the magnets 1,2 to generate an oscillating RF field having uniformity sufficient for a NMR experiment within the working region 6. The construction of such coils is described in more detail in WO-A-94/11748. A pair of receiver coils 4A,4B are also positioned coaxially with the coils 3 to receive NMR signals.

Figure 2:
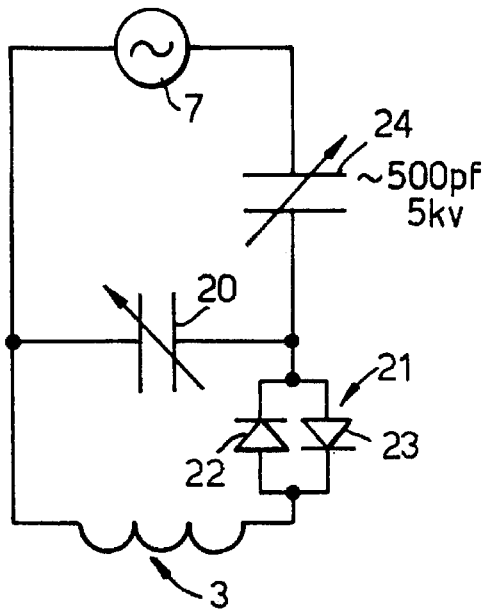
FIG. 2 is a circuit diagram of the transmitter resonant circuit.

FIG. 2 illustrates the electrical, resonant circuit including the transmitter coils 3. As can be seen, the transmitter coils are connected in series with a variable capacitor 20 and a control device 21 consisting of a pair of 60A Schottky barrier diodes 22,23 connected in parallel and in opposite senses. The coils 3 are also connected to an oscillating source 7 via a variable capacitor 24.

The characteristic of the control device 21 is such that current will only flow in the resonant circuit if the voltage across the control device 21 exceeds about 0.5 volts. This prevents noise signals being detected by the transmitter coils. The resonant circuit is connected to a conventional rf source (not shown) via a matching capacitor 24.

Figure 3:
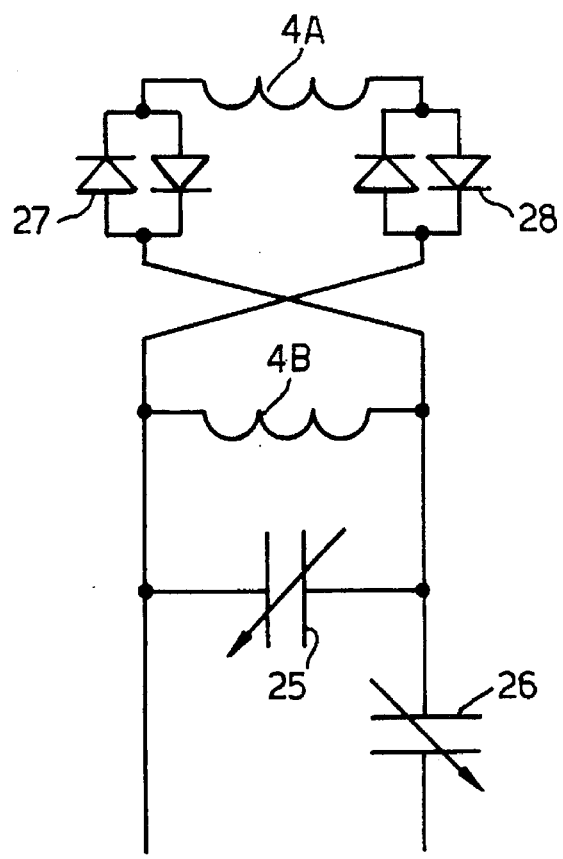
FIG. 3 is a circuit diagram of the receiver coil resonant circuit.

In order to decouple the receiver coil 4A from the transmitter coils 3, we add a further receiver coil 4B, with the two parts connected in series opposition via crossed diodes as shown in FIG. 3. As can be seen in FIG. 3, a conventional receiver coil 4A is connected in a resonant circuit with a variable capacitor 25, the resonant circuit being connected via a matching capacitor 26 to conventional receiving electronics (not shown). In addition, the resonant circuit is connected to a second receiver coil 4B having substantially the same dimensions and number of turns as the receiver coil 4A but electrically connected in opposition and via two pairs of parallel Schottky diodes 27,28. With this arrangement, at low signal levels (received) no current can flow in the coil 4B and the coil 4A acts as a conventional receiver coil, but at high levels (for example during a transmit sequence) current can flow in the coil 4B and the circuit is essentially non-inductive and so the net coupling to the transmitter coil is almost zero.

In one example, each coil 4A,4B comprises twelve turns in two layers (six turns per layer), the two coils being interleaved. The conductor would be 2 mm×1 mm rectangular copper wire, with a 3 mm winding pitch and 1 mm inter-layer gap. The coil would have an inductance of 27.6 μH requiring about 400 pF to tune.

In order to asymmetrically offset the working region 6 from the axes of the magnet assembly, a shield 5 of magnetic material is provided. The shield 5 has a semi-cylindrical form and is laterally offset from the axes of the magnet assembly so that a working region 6 is defined offset in the opposite direction from the shield 5. In practice, the shield 5 will change slightly the field distribution in the radial and axial directions requiring some adjustment of the transmitter coils 3. However, this can be determined by finite element calculation or by experiment.

EXAMPLE

In order to examine the performance of an assembly according to the invention, a semi-cylindrical copper shield 5 of diameter 165 mm was used.

With the receiver coils 4A,4B open circuit and with the tuning capacitors etc. removed, the transmitter coils 2 were energised at 441kHz via a 2.2 ohm resistor inserted solely for test purposes.

Figure 4:
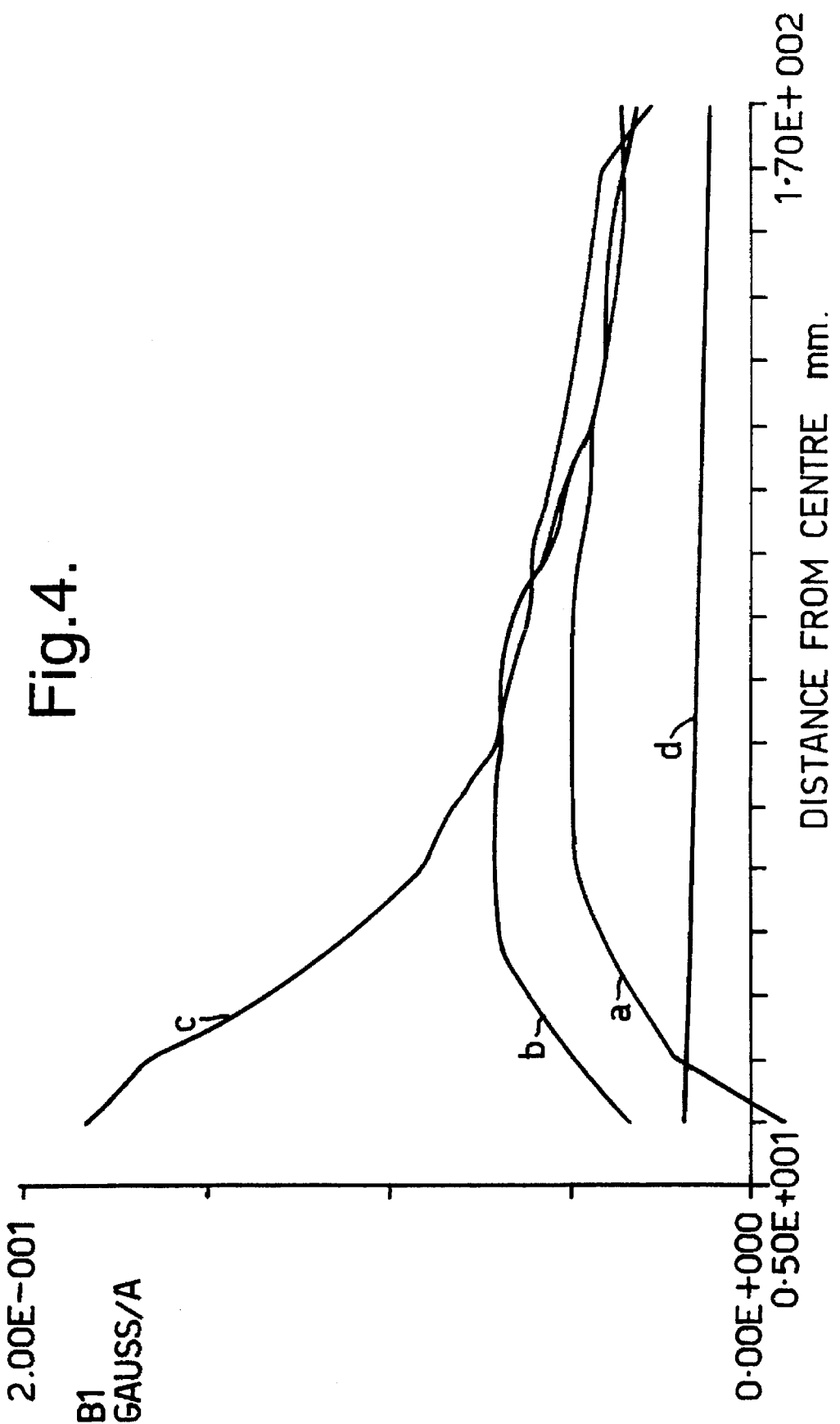
FIG. 4 a graph which illustrates the variation in RF magnetic field with radial distance under different conditions.

The field was plotted (FIG. 4) using a small search coil aligned so as to detect the axial (Z) component of the RF field.

The unshielded results (curve a) were used as a calibration (0.050 gauss per amp and 22.6 μH assumed). The current through the transmitter coils was determined by the voltage across the 2.2 ohm resistor, and the inductance was scaled from this current and the voltage across the coil.

Using these calibrations, the results are as follows: (where L is the inductance of the transmitter coils)

| | Magnetic Field (gauss/Amp) | | | |
| | no screen | screened (L = 20.0 μH) | | |
| | (L = 22.6 μH) | phi = 0 | | phi = 180 |
| R (mm) | z = 0 (mm) | z = 0 | z = −50 | z = 0 |
|---|---|---|---|---|
| 75 | | −0.079 | | |
| 80 | −0.085 | −0.033 | | |
| 85 | −0.033 | 0.011 | | |
| 90 | −0.009 | 0.034 | 0.183 | 0.019 |
| 95 | 0.021 | 0.049 | 0.167 | 0.019 |
| 100 | 0.033 | 0.061 | 0.133 | 0.018 |
| 105 | 0.042 | 0.071 | 0.111 | 0.017 |
| 110 | 0.048 | 0.071 | 0.091 | 0.017 |
| 115 | 0.050 | 0.071 | 0.083 | 0.016 |
| 120 | 0.050 | 0.069 | 0.069 | 0.016 |
| 125 | 0.050 | 0.067 | 0.070 | 0.015 |
| 130 | 0.050 | 0.062 | 0.067 | 0.015 |
| 135 | 0.048 | 0.061 | 0.058 | 0.014 |
| 140 | 0.045 | 0.057 | 0.053 | 0.014 |
| 145 | 0.044 | 0.053 | 0.044 | 0.014 |
| 150 | 0.041 | 0.050 | 0.041 | 0.013 |
| 155 | 0.038 | 0.047 | 0.041 | 0.013 |
| 160 | 0.036 | 0.044 | 0.039 | 0.013 |
| 165 | 0.035 | 0.042 | 0.036 | 0.012 |
| 170 | 0.032 | 0.028 | 0.036 | 0.012 |

The effect of the screen is to reduce the inductance from 22.6 to 20.0 μH. In the forward direction (phi=0°) the field strength is increased from 0.05 gauss/Amp to 0.07 gauss per amp (at Z=0 and 50 mm as shown by curves b,c) and in the reverse direction (phi=180°) it is reduced to 0.015 gauss per amp (curve d).

This implies that 43A is required for 3 gauss, corresponding to a voltage of 2.6kV.

If the Q is unchanged, the power requirement is roughly halved.

Although a few preferred embodiments of the present invention have been shown and described, it would be appreciated by those skilled in the art that changes may be make in these embodiments without departing from the

I claim:

1. A magnet assembly comprising:

a pair of substantially axially aligned, spaced apart first magnets having like poles facing each other;

one or more auxiliary second magnets axially aligned with the pair of first magnets such that all magnets in the assembly are axially aligned and a magnetic field of sufficient homogeneity to perform a nuclear magnetic resonance (NMR) process is generated in a working region laterally offset from said pair of first and said second magnets;

an oscillating magnetic field generating assembly for performing an NMR experiment, including:

a set of electrical coils connected to an oscillating electrical source, said coils being arranged between said pair of first magnets such that the magnetic field generated by said oscillating magnetic field generating assembly is also sufficiently uniform within said working region to perform and NMR experiment; and a shield of electrically conductive material adjacent to and laterally offset from said set of electrical coils such that the magnetic field generated by said oscillating magnetic field generating assembly is asymmetrically offset from the axis of said pair of first magnets.

2. An assembly according to claim 1, wherein said shield has a semi-cylindrical form.

3. A magnet assembly according to claim 1, wherein the axial length of said shield is in the range four to five times the diameter of the electrical coils of said oscillating magnetic field generating assembly.

4. An assembly according to claim 1, wherein said pair of first magnets comprises a pair of permanent magnets.

5. An assembly according to claim 1, wherein said auxiliary magnets comprise permanent magnets.

6. An assembly according to claim 1, wherein said shield is made of copper.

7. An assembly according to claim 1, wherein said electrical coils are positioned co-axially with said first and said second magnets.

8. An assembly according to claim 1, further comprising at least one receiver coil for detecting NMR signals generated from within said working region.

9. An assembly according to claim 8, wherein the at least one receiver coil comprises a first electrical receiver coil electrically connected in a resonant circuit; and second electrical receiver coil connected in opposition to the first electrical coil via two pairs of parallel Schottky diodes.

10. An assembly according to claim 1, wherein the set of electrical coils are arranged such that at least the first order variation of magnetic field with distance is substantially zero.

11. An assembly according to claim 1, wherein the set of electrical coils is arranged to generate a magnetic field within the working volume which has a component in the axial direction which is uniform to 25% from 100 mm to 150 mm radially, and within ±20 mm vertically.

* * * * *